United States Patent
Shuutoku

(10) Patent No.: US 9,899,346 B2
(45) Date of Patent: Feb. 20, 2018

(54) SEMICONDUCTOR DEVICE

(71) Applicant: KABUSHIKI KAISHA TOSHIBA, Minato-ku, Tokyo (JP)

(72) Inventor: Yoshiharu Shuutoku, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 221 days.

(21) Appl. No.: 14/841,543

(22) Filed: Aug. 31, 2015

(65) Prior Publication Data
US 2016/0276263 A1 Sep. 22, 2016

(30) Foreign Application Priority Data
Mar. 16, 2015 (JP) .................. 2015-052197

(51) Int. Cl.
*H01L 23/00* (2006.01)
*H01L 29/78* (2006.01)
(Continued)

(52) U.S. Cl.
CPC .......... *H01L 24/49* (2013.01); *H01L 23/5283* (2013.01); *H01L 24/05* (2013.01); *H01L 29/7801* (2013.01); H01L 23/3157 (2013.01); H01L 23/49565 (2013.01); H01L 23/49568 (2013.01); H01L 23/562 (2013.01); *H01L 24/45* (2013.01); H01L 2224/04042 (2013.01); H01L 2224/05085 (2013.01);
(Continued)

(58) Field of Classification Search
CPC . H01L 2224/45015; H01L 2224/04042; H01L 2224/05085; H01L 2224/73265; H01L 23/3157; H01L 23/49565; H01L 23/49568; H01L 23/5283; H01L 23/562; H01L 24/05; H01L 24/49; H01L 29/7801; H01L 21/8234; H01L 23/5227; H01L 23/528; H05K 3/32; H05K 3/4691
See application file for complete search history.

(56) References Cited

U.S. PATENT DOCUMENTS 5,811,874 A * 9/1998 Lee .................... H01L 23/58
257/666
6,492,599 B1 * 12/2002 Sugihara ............ G01R 1/07314
174/255
(Continued)

FOREIGN PATENT DOCUMENTS

JP 62120355 U 7/1987
JP 07297370 A 11/1995
(Continued)

*Primary Examiner* — Bac Au
(74) *Attorney, Agent, or Firm* — Holtz, Holtz & Volek PC

(57) ABSTRACT

According to one embodiment, a semiconductor device includes lower layer wirings formed on a semiconductor chip, a protection film arranged on the lower layer wirings, an upper layer wiring arranged on the protection film and across a plurality of lower layer wirings, and connected to the lower layer wirings, wherein the upper layer wiring is larger than the lower layer wirings in terms of wiring line width and wiring line thickness, and a stress relaxing portion configured to reduce a stress at an in-corner portion of the upper layer wiring on the protection film, as compared with a case where the in-corner portion is set in 90°.

20 Claims, 3 Drawing Sheets

(51) Int. Cl.
*H01L 23/528* (2006.01)
*H01L 23/31* (2006.01)
*H01L 23/495* (2006.01)

(52) U.S. Cl.
CPC ............... *H01L 2224/45147* (2013.01); *H01L 2224/73265* (2013.01); *H01L 2924/00014* (2013.01); *H01L 2924/01028* (2013.01); *H01L 2924/01029* (2013.01); *H01L 2924/01046* (2013.01); *H01L 2924/01079* (2013.01)

(56) References Cited

U.S. PATENT DOCUMENTS

| | | | |
|---|---|---|---|
| 8,710,659 B2 | 4/2014 | Moriyama et al. | |
| 8,786,092 B2* | 7/2014 | Okazaki | H01L 23/528 |
| | | | 257/260 |
| 9,006,871 B2* | 4/2015 | Fujisawa | H01L 23/3107 |
| | | | 257/663 |
| 9,443,839 B2* | 9/2016 | Lotfi | H01L 23/4824 |
| 2005/0218489 A1* | 10/2005 | Satou | H01L 23/49575 |
| | | | 257/678 |
| 2008/0230874 A1* | 9/2008 | Yamada | H01L 21/78 |
| | | | 257/620 |
| 2008/0296783 A1* | 12/2008 | Enomoto | H01L 23/3107 |
| | | | 257/783 |
| 2010/0164059 A1* | 7/2010 | Suzuki | H01L 21/76816 |
| | | | 257/531 |
| 2011/0186962 A1 | 8/2011 | Moriyama et al. | |
| 2012/0199942 A1* | 8/2012 | Kageyama | H01L 23/5258 |
| | | | 257/529 |
| 2012/0261749 A1* | 10/2012 | Yamada | H01L 21/823475 |
| | | | 257/335 |
| 2012/0319237 A1* | 12/2012 | Cooney, III | H01L 23/5227 |
| | | | 257/531 |
| 2013/0234331 A1* | 9/2013 | Okumoto | H01L 27/124 |
| | | | 257/744 |

FOREIGN PATENT DOCUMENTS

| | | |
|---|---|---|
| JP | 09293723 A | 11/1997 |
| JP | 2001144135 A | 5/2001 |
| JP | 2006108234 A | 4/2006 |
| JP | 2006278832 A | 10/2006 |
| JP | 2008091454 A | 4/2008 |
| JP | 2011222963 A | 11/2011 |

* cited by examiner

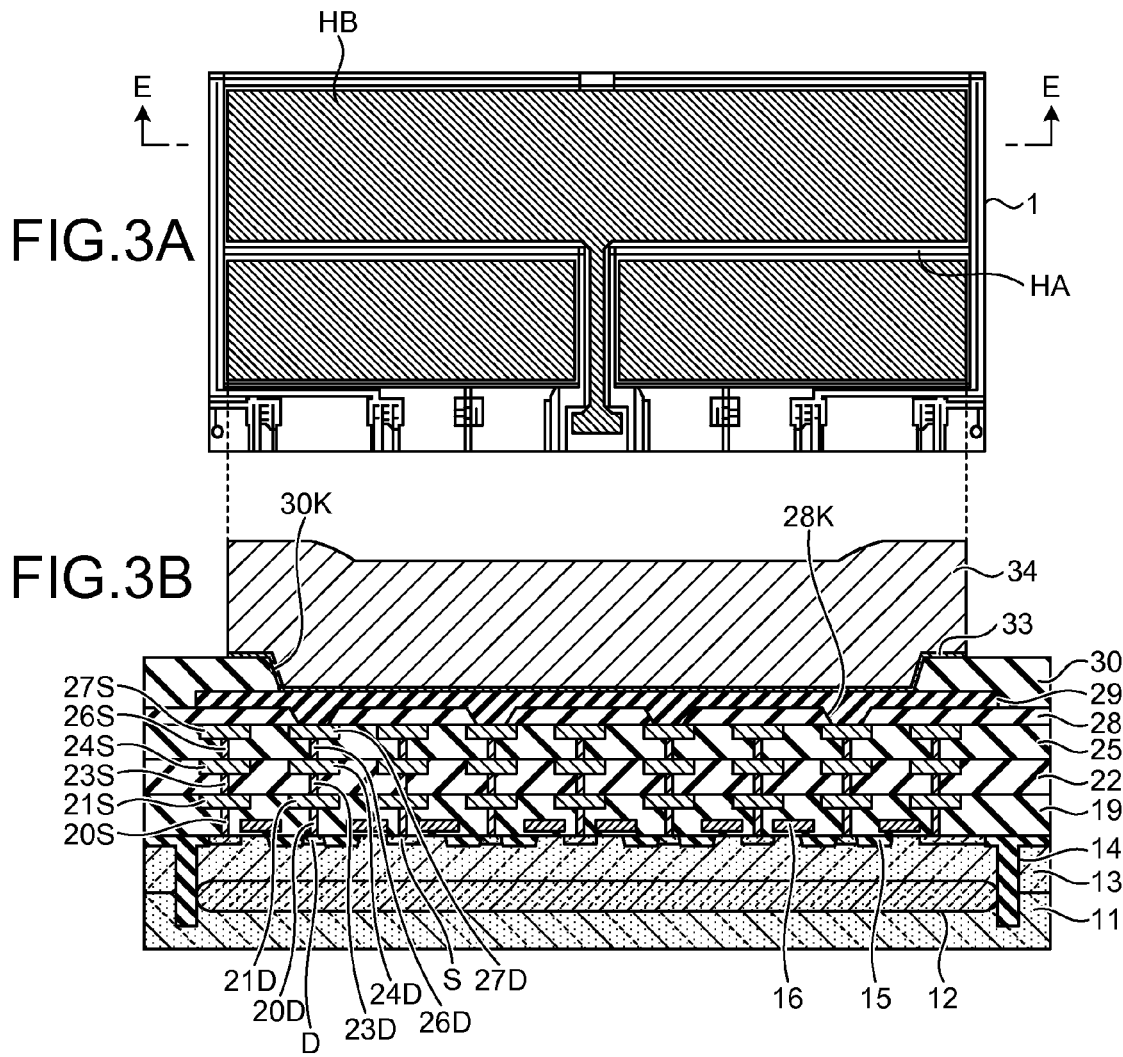
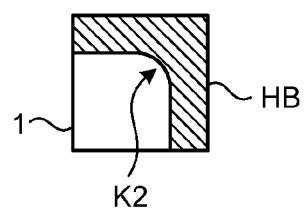

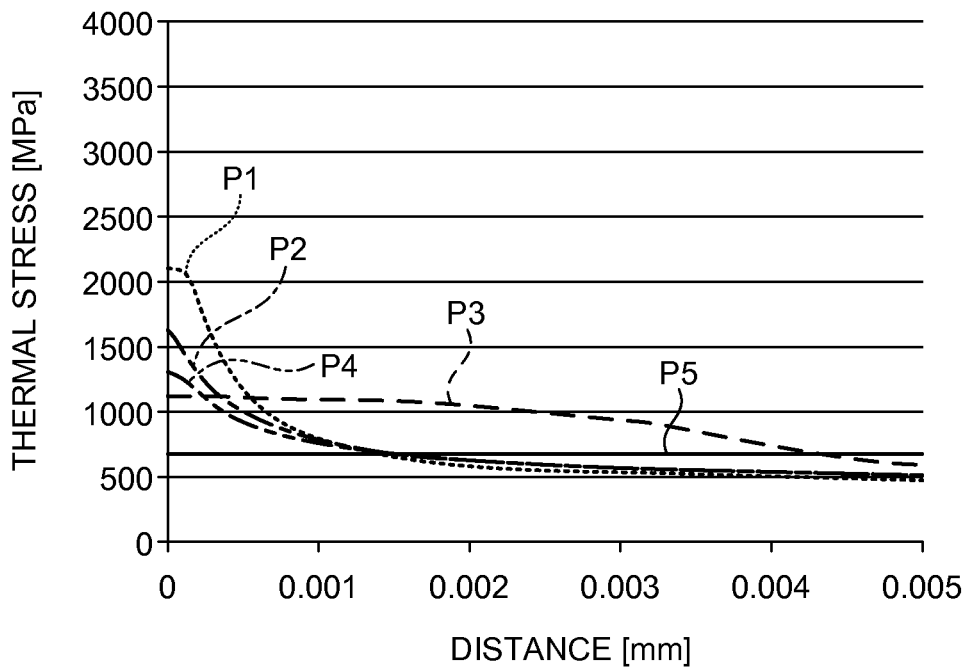
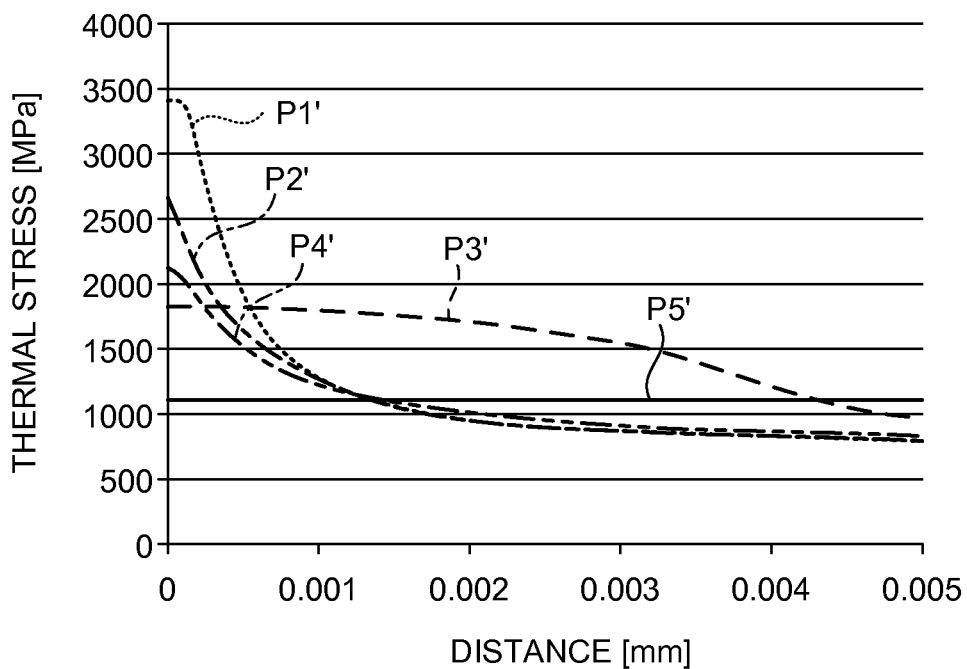

SEMICONDUCTOR DEVICE

CROSS-REFERENCE TO RELATED APPLICATIONS

This application is based upon and claims the benefit of priority from Japanese Patent Application No. 2015-52197, filed on Mar. 16, 2015; the entire contents of which are incorporated herein by reference.

FIELD

Embodiments described herein relate generally to a semiconductor device.

BACKGROUND

As regards semiconductor elements, such as a power transistor, through which a large current flows, there is a case where a Cu plate wiring is used to reduce the ON-resistance.

BRIEF DESCRIPTION OF THE DRAWINGS

FIG. 3A is a plan view showing a portion A of FIG. 2A, in an enlarged state, and FIG. 3B is a sectional view showing a configuration taken along a line E-E of FIG. 3A;

FIG. 4 is a plan view showing an example of an upper layer wiring layout applied to a semiconductor device according to a second embodiment; and FIG. 5A is a view showing a thermal stress distribution at 250° C. in a case where a chamfer shape or round shape is changed, and FIG. 5B is a view showing a thermal stress distribution at 390° C. in a case where a chamfer shape or round shape is changed.

DETAILED DESCRIPTION

In general, according to one embodiment, a semiconductor device includes a semiconductor chip, lower layer wirings, a protection film, an upper layer wiring, and a stress relaxing portion. The lower layer wirings are disposed over the semiconductor chip. The protection film is disposed over the lower layer wirings. The upper layer wiring is disposed over the protection film and across a plurality of lower layer wirings, and connected to the lower layer wirings. The upper layer wiring is larger than the lower layer wirings in terms of wiring line width and wiring line thickness. The stress relaxing portion is configured to reduce a stress at an in-corner portion of the upper layer wiring on the protection film, as compared with a case where the in-corner portion is set in 90°.

Exemplary embodiments of a semiconductor device will be explained below in detail with reference to the accompanying drawings. The present invention is not limited to the following embodiments.

First Embodiment

Figure 1:
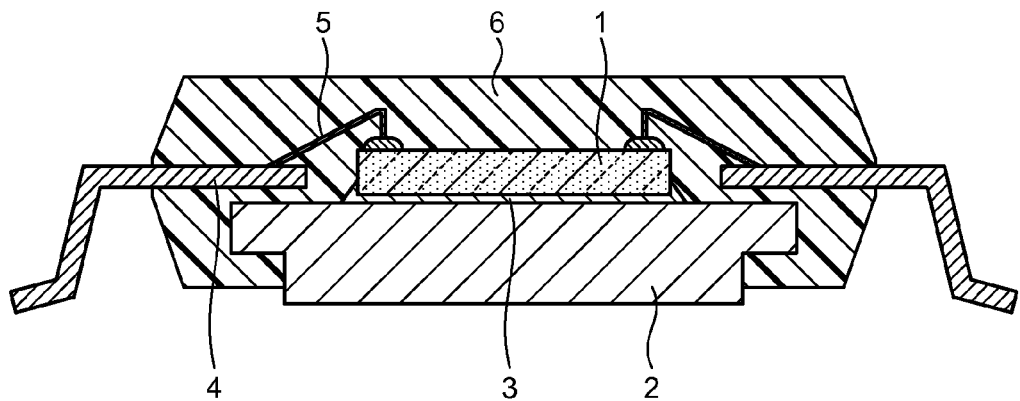
FIG. 1 is a sectional view showing a schematic configuration of a semiconductor device according to a first embodiment.

FIG. 1 is a sectional view showing a schematic configuration of a semiconductor device according to a first embodiment.

As shown in FIG. 1, the semiconductor chip 1 is soldered on a heat sink 2 via a solder material 3. Here, the semiconductor chip 1 may be provided with a power transistor through which a current of 1 A or more flows, for example. This power transistor may be formed of a DMOS (Diffused MOS) transistor to effect that the ON-resistance is reduced while the breakdown voltage is ensured. The solder material 3 may be a Pb/Sn alloy or the like, for example. The heat sink 2 may be made of Cu plated with Au or the like, for example. The semiconductor chip 1 is connected to lead terminals 4 through bonding wires 5. Further, the semiconductor chip 1, the solder material 3, and the bonding wires 5 are sealed by a sealing resin 6. In this case, the respective joint faces between the bonding wires 5 and the lead terminals 4 are also sealed by the sealing resin 6. The lead terminals 4 may be made of Cu plated with Au or the like, for example. The bonding wires 5 may be formed of Cu wires or the like, for example. The sealing resin 6 may be made of a thermosetting resin, such as epoxy resin, for example.

Figure 2A:
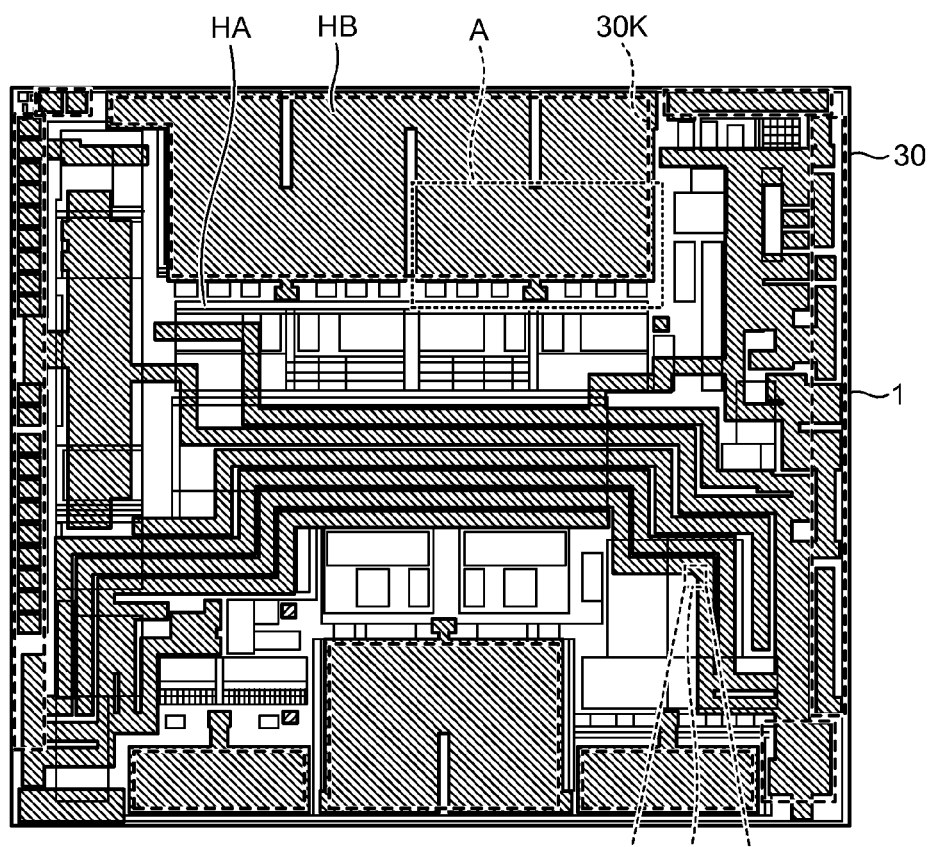
FIG. 2A is a plan view showing an example of a wiring layout in the semiconductor chip shown in FIG. 1.
Figure 2B:
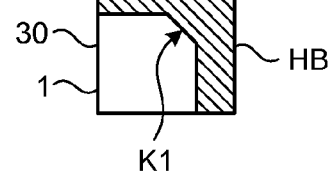
FIG. 2B is a plan view showing a portion B of FIG. 2, (a), in an enlarged state.

FIG. 2A is a plan view showing an example of a wiring layout in the semiconductor chip shown in FIG. 1, and FIG. 2B is a plan view showing a portion B of FIG. 2A in an enlarged state.

As shown in FIG. 2A, lower layer wirings HA are formed on the semiconductor chip 1. A protection film 30 is formed on the lower layer wirings HA. An upper layer wiring HB is formed on the protection film 30, and is connected to the lower layer wirings HA. Here, an opening portion 30K is formed in the protection film 30. Thus, the upper layer wiring HB can be connected to the lower layer wirings HA through the opening portion 30K. The upper layer wiring HB may be designed to be larger than the lower layer wirings HA, in both of the wiring line width and the wiring line thickness. For example, the upper layer wiring HB may be set such that each of the wiring line width and the wiring line thickness is ten or more times as large as that of the lower layer wirings HA. In this respect, each of the wiring line width and wiring line thickness of the lower layer wirings HA may be set to 1 μm or less, the wiring line width of the upper layer wiring HB may be set to 10 μm or more, and the wiring line thickness of the upper layer wiring HB may be set to 5 μm or more. The upper layer wiring HB may be used to reduce the ON-resistance of the power transistor provided in the semiconductor chip 1. The upper layer wiring HB may be formed by use of plating to increase the wiring line thickness. This upper layer wiring HB may be arranged to be present across a plurality of lower layer wirings HA, and so a plate wiring may be constituted.

Here, as shown in FIG. 2B, the in-corner portion of the upper layer wiring HB on the protection film 30 is formed with a chamfer portion K1, which serves to relax a stress at the in-corner portion. As compared with a case where the in-corner portion of the upper layer wiring HB is set in 90° in designing the pattern, the chamfer portion K1 can reduce a stress at the in-corner portion. Here, in order to effectively reduce the stress at the in-corner portion, the chamfering may be preferably set to 5 μm or more, and more preferably set to 20 μm or more.

The upper layer wiring HB may be constituted by a three-layer structure. In this case, the first layer of the upper layer wiring HB may be made of a material having a conductivity equal to or higher than that of the lower layer wirings HA. The second layer of the upper layer wiring HB may be made of a material that prevents corrosion of the first layer of the upper layer wiring HB and serves as an underlying layer for the third layer of the upper layer wiring HB. The third layer of the upper layer wiring HB may be made of a material capable of being in close contact with the bonding wires. For example, the upper layer wiring HB may have a three-layer structure formed of Cu/Ni/Au. In order to avoid use of expensive Au, the upper layer wiring HB may have a three-layer structure formed of Cu/Ni/Pd. As the material of the protection film 30, for example, an inorganic film made of, e.g., $SiO_2$ or SiN may be used, or an organic film made of, e.g., polyimide (PI) may be used.

Here, Ni has a higher Young's modulus than Cu. Accordingly, if both of Ni and Cu are used for the upper layer wiring HB, when a thermal stress is applied to the upper layer wiring HB, the thermal stress concentrates at an in-corner portion of the upper layer wiring HB. Further, the adhesiveness between the upper layer wiring HB and the protection film 30 is poorer than the adhesiveness between the upper layer wiring HB and the lower layer wirings HA. Accordingly, in a state where the protection film 30 is present under the upper layer wiring HB, when a thermal stress concentrates at an in-corner portion of the upper layer wiring HB, the upper layer wiring HB is peeled from the protection film 30 and the Ni of the upper layer wiring HB is cracked, as the case may be. At this time, however, the chamfer portion K1 arranged at the in-corner portion can relax the concentration of the thermal stress at the in-corner portion of the upper layer wiring HB. Consequently, it becomes possible to prevent the upper layer wiring HB from being peeled from the protection film 30, and to prevent the Ni of the upper layer wiring HB from being cracked. Thus, as shown in FIG. 1, even in a case where the semiconductor chip 1 is soldered on the heat sink 2, the semiconductor chip 1 can ensure its reliability.

FIG. 3A is a plan view showing a portion A of FIG. 2A in an enlarged state, and FIG. 3B is a sectional view showing a configuration taken along a line E-E of FIG. 3A. Here, FIG. 3A and FIG. 3B show an example in which the semiconductor chip 1 is provided with DMOS transistors, each of which is of an STI (Shallow Trench Isolation) offset type.

As shown in FIG. 3A and FIG. 3B, an epitaxial semiconductor layer 13 is formed on a semiconductor substrate 11. At the boundary between the semiconductor substrate 11 and the epitaxial semiconductor layer 13, a high-concentration impurity diffusion layer 12 is embedded. As the material of the semiconductor substrate 11 and the epitaxial semiconductor layer 13, for example, Si, Ge, SiGe, GaAs, GaAlAs, InP, GaP, GaN, SiC, or InGaAsP may be used. They may be set such that the conductivity type of the semiconductor substrate 11 is P-type, the conductivity type of the epitaxial semiconductor layer 13 is N-type, and the conductivity type of the high-concentration impurity diffusion layer 12 is $N^+$-type.

In the epitaxial semiconductor layer 13, STIs 15 are embedded. Around the STIs 15, DTIs (Deep Trench Isolation) 14 are embedded such that they penetrate the epitaxial semiconductor layer 13 and reach the semiconductor substrate 11. As the material of the STIs 15 and the DTIs 14, for example, $SiO_2$ or the like may be used.

In the epitaxial semiconductor layer 13, source layers S and drain layers D are formed in an active region between the DTIs 14. The conductivity type of the source layers S and drain layers D may be set in $P^+$-type. Gate electrodes 16 are arranged on the active region respectively at portions between the source layers S and the drain layers D. In this case, in order to increase the breakdown voltage of each of the DMOS transistors, the portion between the drain layer D and the channel region under each of the gate electrodes 16 may be provided with an offset by an amount corresponding to an STI 15.

On the epitaxial semiconductor layer 13, an interlayer insulating film 19 is formed such that the gate electrodes 16 are embedded therein. Further, in the interlayer insulating film 19, wiring lines 21S and 21D arranged above the gate electrodes 16 are embedded. Each of the wiring lines 21S is connected to the corresponding source layer S through a plug electrode 20S, and each of the wiring lines 21D is connected to the corresponding drain layer D through a plug electrode 20D. On the wiring lines 21S and 21D, an interlayer insulating film 22 is formed. In the interlayer insulating film 22, wiring lines 24S and 24D are embedded. Each of the wiring lines 24S is connected to the corresponding wiring line 21S through a plug electrode 23S, and each of the wiring lines 24D is connected to the corresponding wiring line 21D through a plug electrode 23D. On the wiring lines 24S and 24D, an interlayer insulating film 25 is formed. In the interlayer insulating film 25, wiring lines 27S and 27D are embedded. Each of the wiring lines 27S is connected to the corresponding wiring line 24S through a plug electrode 26S, and each of the wiring lines 27D is connected to the corresponding wiring line 24D through a plug electrode 26D. On the wiring lines 27S and 27D, an interlayer insulating film 28 is formed. In the interlayer insulating film 28, opening portions 28K are formed such that the wiring lines 27D are exposed therein. On the interlayer insulating film 28, a pad electrode 29 is formed. The pad electrode 29 is connected to the wiring lines 27D through the opening portions 28K. In this case, in order to reduce the ON-resistance, a plurality of drain layers D may be connected in parallel with each other, through the wiring lines 21D, 24D, and 27D. As the material of the gate electrodes 16, for example, polycrystalline silicon may be used. As the material of the wiring lines 21S, 21D, 24S, 24D, 27S, and 27D, for example, a metal, such as Al or Cu, may be used. As the material of the plug electrodes 20S, 20D, 23S, 23D, 26S, and 26D, for example, a metal, such as W, Al, or Cu, may be used. As the material of the pad electrode 29, for example, a metal, such as Al, may be used. As the material of the interlayer insulating films 19, 22, 25, and 28, for example, $SiO_2$ or the like may be used. The wiring line width of the wiring lines 21S, 21D, 24S, 24D, 27S, and 27D may be set to about 0.5 to 1 μm, for example. The wiring line thickness of the wiring lines 21S, 21D, 24S, 24D, 27S, and 27D may be set to about 0.2 to 0.3 μm, for example. The wiring lines 21S, 21D, 24S, 24D, 27S, and 27D may be formed by use of sputtering or CVD.

On the pad electrode 29, a protection film 30 is formed. In the protection film 3, an opening portion 30K is formed such that the pad electrode 29 is exposed therein. On the protection film 30, a plate wiring 34 is formed through an under-barrier metal film 33. The plate wiring 34 is connected to the pad electrode 29 through the opening portion 30K. The plate wiring 34 may be designed to be larger than the wiring lines 21S, 21D, 24S, 24D, 27S, and 27D, in both of the wiring line width and the wiring line thickness. The plate wiring 34 may be arranged to be present across a plurality of wiring lines 21S, 21D, 24S, 24D, 27S, and 27D. In order to improve the heat dissipation of the DMOS transistors, the plate wiring 34 may be arranged to cover the DMOS transistors. The plate wiring 34 may be set such that each of the wiring line width and the wiring line thickness is ten or more times as large as that of the wiring lines 21S, 21D, 24S, 24D, 27S, and 27D. In this respect, the wiring line width of the plate wiring 34 may be set to 10 μm or more, and the wiring line thickness of the plate wiring 34 may be set to 5 µm or more. As the material of the under-barrier metal film 33, for example, a two-layer structure formed of Ti/Cu may be used. The wiring lines 21S, 21D, 24S, 24D, 27S, and 27D may be used as the lower layer wirings HA shown in FIG. 2, (a). The plate wiring 34 may be used as the upper layer wiring HB shown in FIG. 2A.

Second Embodiment

FIG. 4 is a plan view showing an example of an upper layer wiring layout applied to a semiconductor device according to a second embodiment.

As shown in FIG. 4, the in-corner portion of the upper layer wiring HB is formed with a round portion K2 in place of the chamfer portion K1 shown in FIG. 2B. As compared with a case where the in-corner portion of the upper layer wiring HB is set in 90° in designing the pattern, the round portion K2 can reduce a stress at the in-corner portion. Here, in order to effectively reduce the stress at the in-corner portion, the rounding may be preferably set to 5 µm or more, and more preferably set to 20 µm or more.

FIG. 5A is a view showing a thermal stress distribution at 250° C. in a case where the chamfer shape or round shape is changed, and FIG. 5B is a view showing a thermal stress distribution at 390° C. in a case where the chamfer shape or round shape is changed. Here, as regards FIG. 5A and FIG. 5B, a simulation was performed by use of a model having a five-layer structure formed of Si/PI/Cu/Ni/Au and including a pattern formed in the Ni/Au, to obtain a stress applied to the Ni. Further, in FIG. 5A and FIG. 5B, P1 and P1' indicate a case without any chamfering, P2 and P2' indicate a case with chamfering of 5 µm, P3 and P3' indicate a case with chamfering of 20 µm, P4 and P4' indicate a case with rounding of 5 µm, and P5 and P5' indicate a case with rounding of 20 µm. Here, the horizontal axis denotes a distance from the stress peak position.

As shown in FIG. 5A and FIG. 5B, the stress applied to the Ni is larger at 390° C. than at 250° C. With an increase in the chamfering or rounding, the stress is lowered. Since the rounding brings about no angles, it provides a larger effect of relaxing the stress, as compared with the chamfering. Accordingly, in designing the pattern, the in-corner portion of the upper layer wiring HB is preferably formed with rounding of 5 µm or more, and more preferably of 20 µm or more.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor chip;
   lower layer wirings disposed over the semiconductor chip;
   a protection film disposed over the lower layer wirings;
   an upper layer wiring disposed over the protection film and across a plurality of the lower layer wirings, and connected to the lower layer wirings, the upper layer wiring being larger than the lower layer wirings in terms of wiring line width and wiring line thickness;
   a pad electrode disposed between the lower layer wirings and the upper layer wiring, the pad electrode layer having a plurality of lower protrusions, wherein each of the plurality of lower protrusions connects to a corresponding one of the plurality of lower layer wirings that are connected to the upper layer wiring; and
   a stress relaxing portion configured to reduce a stress at an in-corner portion of the upper layer wiring on the protection film, as compared with a case where the in-corner portion is set to 90°.

2. The semiconductor device of claim 1, wherein the stress relaxing portion is formed of a chamfer portion or round portion disposed at the in-corner portion.

3. The semiconductor device of claim 2, wherein chamfering of the chamfer portion or rounding of the round portion is set to 20 µm or more.

4. The semiconductor device of claim 3, wherein the upper layer wiring has a Cu/Ni/Au structure.

5. The semiconductor device of claim 3, wherein the upper layer wiring has a Cu/Ni/Pd structure.

6. The semiconductor device of claim 1, wherein the upper layer wiring includes:
   a first wiring having a conductivity equal to or higher than that of a material of the lower layer wirings,
   a second wiring disposed on the first wiring and configured to prevent corrosion of the first wiring, and
   a third wiring disposed on the second wiring and capable of being in close contact with bonding wires.

7. The semiconductor device of claim 1, wherein the upper layer wiring is formed of a plated wiring.

8. The semiconductor device of claim 1, wherein the protection film includes opening portions formed therein, and
   wherein the upper layer wiring is connected to the lower layer wirings through the opening portions.

9. The semiconductor device of claim 1, wherein adhesiveness between the upper layer wiring and the protection film is poorer than adhesiveness between the upper layer wiring and the lower layer wirings.

10. The semiconductor device of claim 1, wherein the wiring line width of the upper layer wiring is ten or more times as large as the wiring line width of the lower layer wirings, and the wiring line thickness of the upper layer wiring is ten or more times as large as the wiring line thickness of the lower layer wirings.

11. A semiconductor device comprising:
    a semiconductor chip;
    DMOS (Diffused MOS) transistors disposed in the semiconductor chip;
    a plurality of lower layer wirings respectively connected to drains of the DMOS transistors, the lower layer wirings being parallel to each other;
    a protection film disposed over the lower layer wirings;
    an upper layer wiring disposed over the protection film and covering the DMOS transistors, the upper layer wiring being connected to the plurality of lower layer wirings, and larger than the lower layer wirings in terms of wiring line width and wiring line thickness;
    a pad electrode disposed between the lower layer wirings and the upper layer wiring, the pad electrode layer having a plurality of lower protrusions, wherein each of the plurality of lower protrusions connects to a corresponding one of the plurality of lower layer wirings that are connected to the upper layer wiring;

a stress relaxing portion configured to reduce a stress at an in-corner portion of the upper layer wiring on the protection film, as compared with a case where the in-corner portion is set to 90°;
bonding wires connected to the upper layer wiring; and
a heat sink soldered to the semiconductor chip.

12. The semiconductor device of claim 11, wherein the stress relaxing portion is formed of a chamfer portion or round portion formed at the in-corner portion.

13. The semiconductor device of claim 12, wherein chamfering of the chamfer portion or rounding of the round portion is set to 20 μm or more.

14. The semiconductor device of claim 13, wherein the upper layer wiring has a Cu/Ni/Au structure.

15. The semiconductor device of claim 13, wherein the upper layer wiring has a Cu/Ni/Pd structure.

16. The semiconductor device of claim 11, wherein the upper layer wiring includes:
a first wiring having a conductivity equal to or higher than that of a material of the lower layer wirings,
a second wiring disposed on the first wiring and configured to prevent corrosion of the first wiring, and
a third wiring disposed on the second wiring and capable of being in close contact with the bonding wires.

17. The semiconductor device of claim 11, wherein the upper layer wiring is formed of a plated wiring.

18. The semiconductor device of claim 11, wherein the protection film includes opening portions formed therein, and
wherein the upper layer wiring is connected to the lower layer wirings through the opening portions.

19. The semiconductor device of claim 11, wherein adhesiveness between the upper layer wiring and the protection film is poorer than adhesiveness between the upper layer wiring and the lower layer wirings.

20. The semiconductor device of claim 11, wherein the wiring line width of the upper layer wiring is ten or more times as large as the wiring line width of the lower layer wirings, and the wiring line thickness of the upper layer wiring is ten or more times as large as the wiring line thickness of the lower layer wirings.

* * * * *